United States Patent [19]
Bull

[11] 4,087,696
[45] May 2, 1978

[54] ELECTRICAL BRANCH CIRCUIT STRUCTURE MEANS

[75] Inventor: Dale L. Bull, Reed City, Mich.

[73] Assignee: Nartron Corporation, Reed City, Mich.

[21] Appl. No.: 734,237

[22] Filed: Oct. 20, 1976

[51] Int. Cl.² .......................................... H05K 15/00
[52] U.S. Cl. .......................... 307/10 LS; 174/52 PE;
338/214; 338/260; 338/275; 339/104
[58] Field of Search ............... 307/10 LS; 174/52 PE,
174/76; 338/260, 214, 275; 361/331, 380;
339/102 R, 104, 275 R; 336/105; 200/298, 302;
240/2.13

[56] References Cited

U.S. PATENT DOCUMENTS

| | | | |
|---|---|---|---|
| 2,466,211 | 12/1947 | Crockett | 338/260 |
| 2,683,767 | 7/1954 | Cunningham | 174/52 PE |
| 2,792,481 | 5/1955 | Wood | 338/214 |
| 3,226,463 | 4/1961 | Wallace | 174/52 PE |
| 3,270,191 | 8/1966 | Hilliard | 240/2.13 |

Primary Examiner—Robert K. Schaefer
Assistant Examiner—Michael K. Mutter
Attorney, Agent, or Firm—Lon H. Romanski

[57] ABSTRACT

An electrical branch circuit for use as in a swingable door of an automotive vehicle is shown having an electrical load connected to first ends of electrical conductors which, in turn, at their respective other ends are connected to terminal means mechanically connectable to related circuit means, resistor means is connected into at least one of the electrical conductors as to be generally between the electrical load and the terminal means.

16 Claims, 10 Drawing Figures

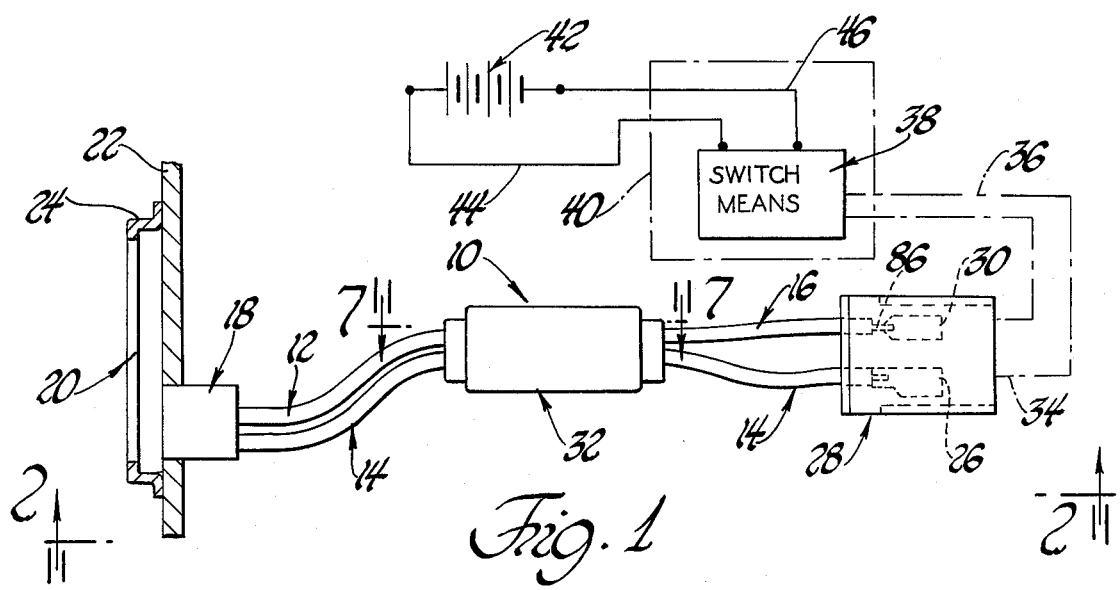
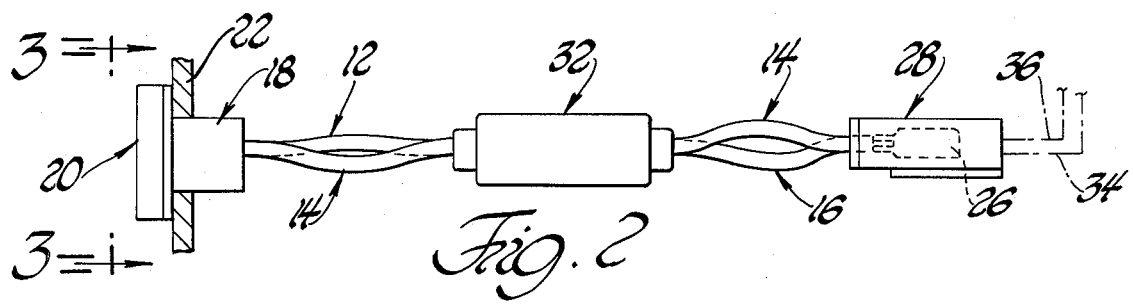
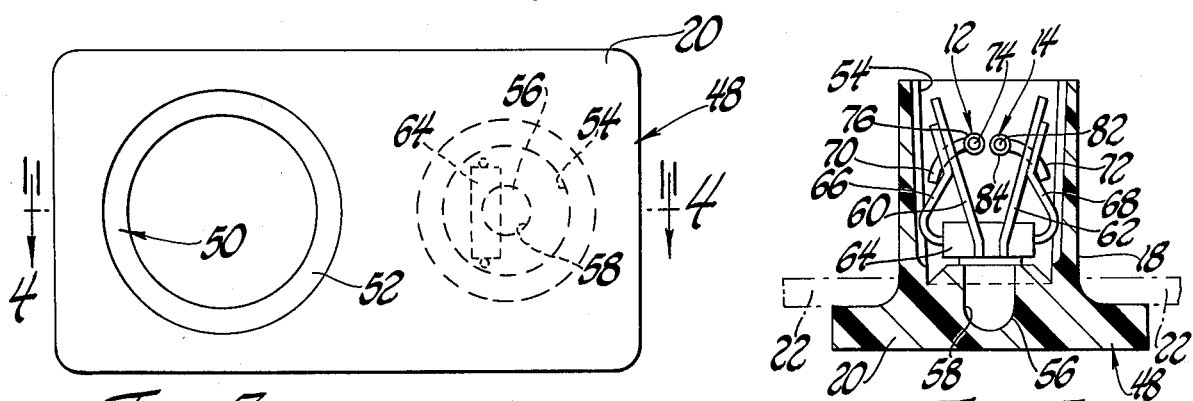
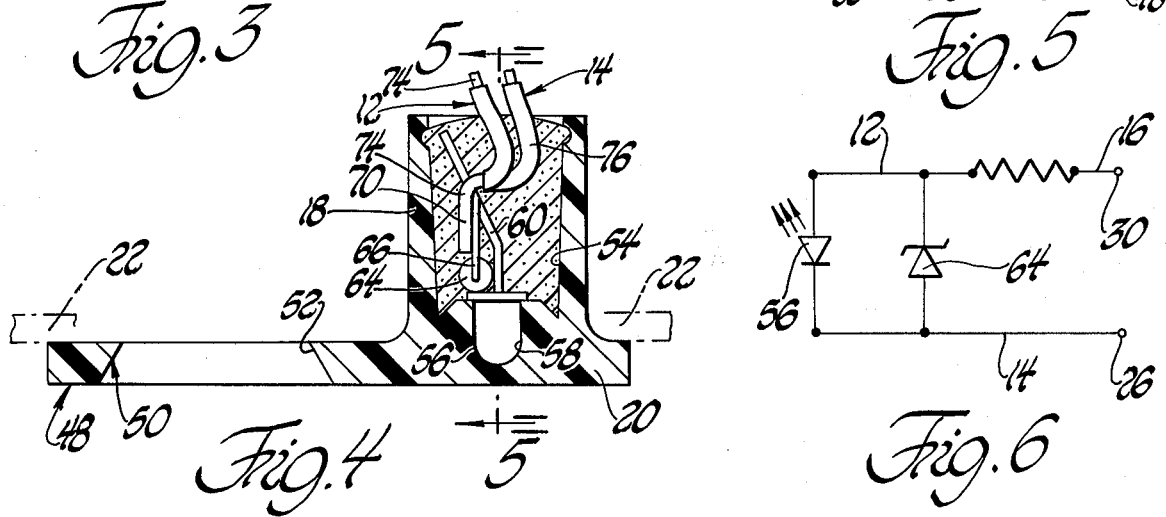

ELECTRICAL BRANCH CIRCUIT STRUCTURE MEANS

BACKGROUND OF THE INVENTION

It has been suggested to provide vehicle entry illumination system means whereby illumination is provided at the vehicular entry door locks thereby better enabling the location of such door lock in the night time and facilitating the insertion thereinto of an associated key.

Generally, such systems employ a light or illumination source in relatively close proximity to the lock tumbler mechanism with related electrical energizing and logic control circuit means situated within the passenger compartment as, for example, underneath the vehicle dash panel.

The prior art realized that the overall electrical system would have to be separated into various sections and that certain of such sections would comprise a separable wiring harness which could be separately assembled into the vehicle door and subsequently electrically connected to the remaining energizing and control circuit portions.

Since substantially all vehicles now operate with 12 volt electrical systems and since the bulbs being employed for creating the illumination required a smaller voltage as, for example, 2.0 volts suitable dropping resistor means were required within the output portion of the circuitry leading and connectable to the wiring harness installed in the door.

During mass production of automotive vehicles, components thereof must be tested prior to assembly in order to make sure that such components are operative and to avoid the high cost of disassembly and replacement of defective components. Likewise, the wiring harness and bulb means, with which this invention is concerned, were and are required to undergo testing prior to installation thereof within the vehicle door assembly.

As was previously stated, substantially all automotive vehicles employ 12.0 volt electrical systems; therefore, the testing equipment employed by such vehicle manufacturers is also 12.0 volt and, in order to standardize and eliminate the possibility that an employee will use the wrong testing apparatus, all such apparatus is not modified to test at any other voltage than 12.0 volts. Accordingly, the vehicle manufacturer, in effect, had no way of checking such wiring harness before their assembly into the vehicle door because the testing thereof with standard 12.0 volt testing equipment would destroy the lamp or bulb means carried by the wiring harness.

It was then discovered and suggested that the dropping resistor means, normally not associated with the wiring harness in the door and actually carried by and forming a part of the power output circuit portion within the interior of the vehicle, actually be placed in circuit with the conductors forming the said door wiring harness thereby enabling the said door wiring harness to be tested by any standard 12.0 volt testing equipment and still be able to plug into the related power output circuit portion. This not being believed possible by those skilled in the art, the invention now provides structure whereby such can be attained.

SUMMARY OF THE INVENTION

According to the invention, a wiring harness means comprises at least first and second electrical conductor means, said first electrical conductor means having a first conductive end and a second conductive end, said second electrical conductor means having a third conductive end and a fourth conductive end, electrically insulating cover means covering at least a major portion of said first and second electrical conductor means, said first conductor means also having fifth and sixth conductive ends situated generally between said first and second conductive ends, resistance means electrically connected in series relationship with said fifth and sixth conductive ends, and enveloping means enveloping said resistance means and said fifth and sixth ends as well as a portion of said insulating cover means, said enveloping means serving to provide a mechanical connection across said resistance means as to thereby transmit at least a major portion of any tension forces applied to said first and second ends through said enveloping means and not through said resistance means.

Various general and specific objects and advantages of the invention will become apparent when reference is made to the following detailed description considered in conjunction with the accompanying drawings.

BRIEF DESCRIPTION OF THE DRAWINGS

In the drawings wherein for purposes of clarity certain details and/or elements may be omitted from one or more views:

FIG. 1 is generally what may be considered, for purposes of reference, a top plan view of a wiring harness constructed in accordance with the teachings of the invention;

FIG. 2 is a view of the wiring harness taken generally on the plane of line 2—2 of FIG. 1 and looking in the direction of the arrows;

FIG. 3 is a view, in enlarged scale, taken generally on the plane of line 3—3 of FIG. 2 and looking in the direction of the arrows;

FIG. 4 is a cross-sectional view taken generally on the plane of line 4—4 of FIG. 3 and looking in the direction of the arrows;

FIG. 5 is a cross-sectional view taken generally on the plane of line 5—5 of FIG. 4 and looking in the arrows;

FIG. 6 is a schematic wiring diagram of the circuitry comprising the harness of FIGS. 1-5;

DETAILED DESCRIPTION OF THE PREFERRED EMBODIMENTS

Figure 7:
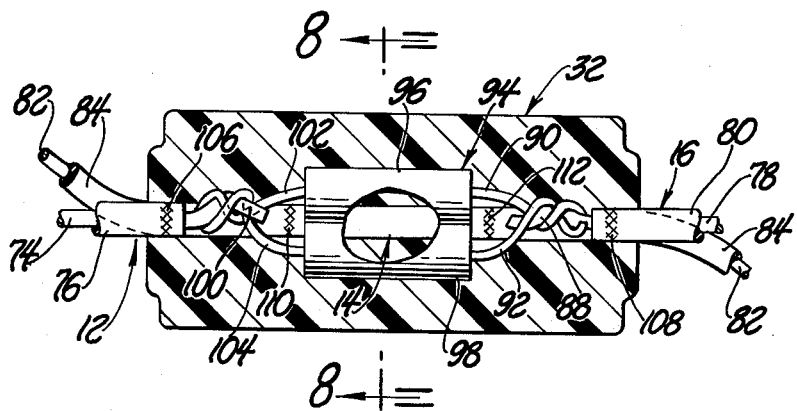
FIG. 7 is a cross-sectional view, in enlarged scale, taken generally on the plane of line 7—7 of FIG. 1 and looking in the direction of the arrows.

Referring now in greater detail to the drawings, FIG. 1 illustrates a wiring harness 10 comprising electrical conductor means 12, 14 and 16 with first ends of conductors 12 and 14 being electrically connected or connectable to, for example, electrically energizeable light producing means carried as within housing means 18 and associated lens means 20.

In the embodiment show, the lens means 20 is illustrated as being carried on and externally of a vehicular passenger access door panel 22. Any suitable means may be employed for operatively securing the lens means 20 to door panel 22 as, for example, suitable peripheral frame-like clamping or retainer means fragmentarily illustrated at 24.

The other end of electrical conductor means 14 may be provided as with, for example, a terminal contact 26 which, in turn, may be operatively received and retained within, for example, a terminal connector or housing 28 many of which are well known in the art.

Similarly an outer end of electrical conductor means 16 may also be provided with, for example, a terminal contact 30 which also, in turn, may be operatively received and retained within the terminal connector or housing 28.

The opposite ends of conductor means 12 and 16 are each connected to resistor means contained generally within connector means 32 as will be hereinafter described in greater detail.

As generally depicted, the terminal connector or housing 28 may be adapted to receive related connectable conductor means 34 and 36, for respective electrical connection to terminals 26 and 30, leading as to related remotely situated switch means 38 which, in fact, may be control logic means. The means 38 may be located in an area 40 as, for example, under the dash panel within the interior of a vehicle while the harness 10 could be situated within the swingable door assembly for permitting entry into such a vehicle's passenger compartment. As generally schematically illustrated, a source of electrical potential 42 may be electrically connected to means 38 as by conductor means 44 and 46.

As illustrated in FIGS. 4 and 5, the lens 20 and housing 18 may be integrally formed of a plastic material such as, for example, polyvinyl chloride, as to define a bezel structure 48. An aperture 50, preferably of a conical surface 52, provides access as to a key-operated vehicle door lock tumbler (not shown but well known in the art) carried as within the door panel 22.

A main chamber 54 formed generally within housing portion 18 is adapted to receive various electrical components therein. For example, a light generating source such as, for example, a light emitting diode (L.E.D.) 56 is shown as being received within a recess or chamber portion 58 and has its electrical leads 60, 62 disposed generally upwardly therefrom (as viewed in FIG. 4). A zener diode 64 is also disposed within chamber 54 and has its leads 66 and 68 electrically connected as by, for example, being respectively soldered to L.E.D. leads 60 and 62. Further, as also shown in FIG. 5, conductor means 12 and 14 have their respective ends 70 and 72 electrically connected as by, for example, soldering, to both leads 66, 60 and leads 62, 68, respectively. As should be evident, the L.E.D. 56 and zener diode 64 are each electrically connected across conductor means 12 and 14 as to be electrically parallel to each other as generally depicted in FIG. 6. As best illustrated in FIG. 4, the various electrical components are preferably encapsulated within chamber 54 as by an electrically non-conductive sealing material such as, for example, an epoxy.

Conductor means 12 comprises a centrally or generally medially disposed electrically conductive core portion (hereinafter for ease of reference being called "wire") 74 and an outer electrically non-conductive, or dielectric, insulating covering or sheathing 76. Similarly, conductor means 16 comprises a centrally or generally medially disposed electrically conductive core portion (hereinafter for ease of reference being called "wire") 78 and an outer electrically non-conductive insulating covering or sheathing 80. Likewise, conductor means 14 comprises a centrally or generally medially disposed electrically conductive core portion (hereinafter for ease of reference being called "wire") 82 and an outer electrically non-conductive covering or sheathing 84.

As was previously generally indicated, a first outer end 86 of conductor means 16 wire 78 is operatively electrically connected to terminal member 30 (as generally shown in FIG. 1) while a second inner end 88 of conductor means 16 wire 78 is operatively electrically connected to conductor leads 90 and 92 of resistor means 94 which, in the embodiment shown, comprises a plurality of resistor means 96 and 98 as to thereby have lead 90 extending from resistor 96 and lead 92 extending from resistor 98.

Somewhat similarly, the first outer end 70 of conductor means 12 wire 74 is operatively electrically connected to L.E.D. 56 and zener diode 64 (as generally shown in FIG. 4) while a second inner end 100 of conductor means 12 wire 74 is operatively electrically connected to conductor leads 102 and 104 of resistors 96 and 98, respectively, as shown in FIG. 7. Obviously, if desired, wire end 88 may be soldered to leads 90 and 92 while, also if desired, wire end 100 may be soldered to leads 102 and 104.

Figure 8:
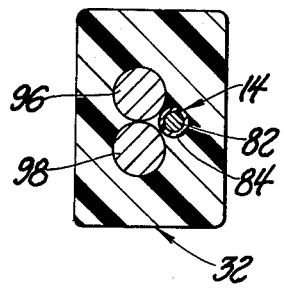
FIG. 8 is a cross-sectional view taken generally on the plane of line 8—8 of FIG. 7 and looking in the direction of the arrows.

In comparison, it can be seen that conductor means 14 is continuous as between its designated ends and, preferably, is situated as to be nested against the resistors 96 and 98 as generally depicted in FIG. 8.

In the preferred embodiment, the connector 32 is formed of a molded plastic material as to envelop resistor means 94, wire ends 88 and 100, leads 90 and 92, leads 102 and 104, a portion of insulating cover 80, a portion of insulating cover 76 and a portion of insulating cover 84 of conductor means 14 with a related portion of wire 82 therein. The connector 32 may be made of any suitable material; however, in certain embodiments constructed and tested, it has been found that polyvinyl chloride is a very suitable material. In practicing the invention: a first conductor means such as 12 has a portion of its electrically insulating coating or cover 76 removed as to expose a portion of its wire; a second conductor means such as 16 has a portion of its electrically insulating coating or cover 80 removed as to expose a portion of its wire; an electrical component of relatively low tensile strength such as resistor means 94 is electrically connected to the said exposed portions of wires of conductor means 12 and 16; and electrically insulating material is molded about the electrical component, the electrical connections between said wires and the eletrical component, and portions of the insulating cover means 76 and 80 as to thereby form a connector thereacross providing for the transmission therethrough of tensile stresses otherwise applicable through the said electrical component. In thusly molding the connector material, the material forming covering or coatings 76 and 80 may be somewhat thermoplastically deformed and at least somewhat heat fused to the material forming the connector 32.

Although it has not been found necessary to the practice of the invention, nevertheless in certain situations it may be desirable to provide additional means on the coatings or cover means as of the respective conductor means 12 and 16 in order to enhance the actual connection as between such insulating coatings and the connector 32. To this end certain means may be carried by or formed on the portions of the wire coatings generally enveloped by the connector 32. For example, roughened or suitably raised or indented surfaces may be formed on coatings 76 and 80 as at 106 and 108 of FIG. 7 in order to thereby enhance possible fusion of such surfaces with connector 32 and, as well, to provide for an effective mechanical interlock therebetween. If desired, similar prepared or formed surfaces may be formed on or carried by insulating cover means 84 of conductor means 14 such as generally indicated at 110 and 112 of FIG. 7.

In any event, it has been found that a connector 32, which may even be a mechanical connector, placed as to bridge the low-tensile-strength electrical component and structurally interconnect the conductor means 12 and 16 leading to the said electrical component provides a means whereby when a relatively severe tensile stress is applied as from conductor means 12 to conductor means 16 such applied tensile stress does not have to be experienced by the low-tensile-strength electrical component but rather is experienced and transmitted by the connector 32. As already indicated, in the preferred embodiment of the invention a second conductor means 14 is also enveloped by the connector 32 to thereby further assist in the transmission of tensile stresses and further avoiding the application of such tensile stresses to the low-tensile-strength electrical component. With circuit means formed in accordance with the teachings of the invention, tension forces in the order of 25 pounds across the connector 32 were experienced without failure of the circuit.

Figure 9:
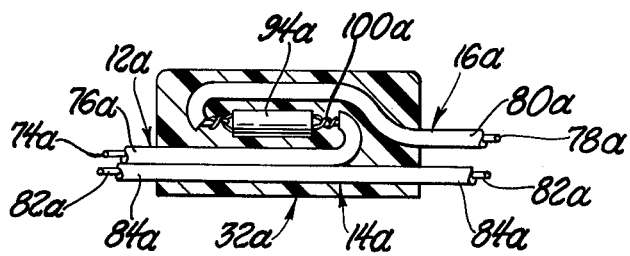
FIG. 9 is a view similar to that of FIG. 7 and illustrating one modified form of the invention.

FIG. 9 illustrates a further embodiment or modification of the invention. All elements in FIG. 9 which are like or similar to those of the preceding Figures are identified with like reference numbers provided with a suffix "a." As will be noted from an inspection of FIG. 9, conductor means 12a and 16a are generally looped about the relatively low-tensile-strength electrical component 94a as to have the respective exposed inner wires ends thereof electrically connected thereto at ends opposite to that shown in FIG. 7.

Figure 10:
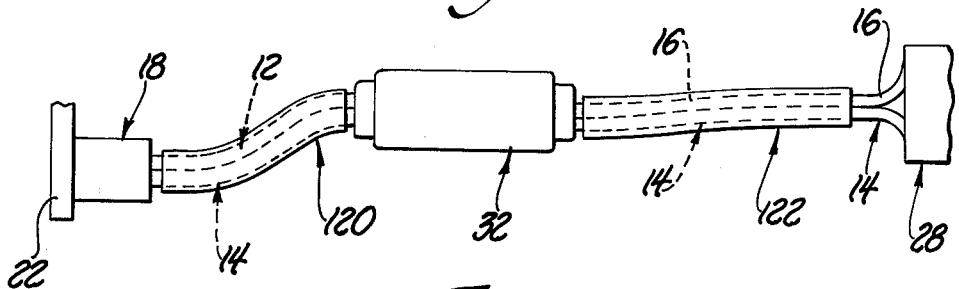
FIG. 10 is a view similar to that of FIG. 1 and illustrating a further embodiment of the invention.

FIG. 10 illustrates a further embodiment of the invention as shown in FIG. 1. In comparing the structures of FIG. 10 and FIG. 1, it can be seen that in FIG. 10 the conductor means 12 and 14 are contained within a generally tubular sleeve or sheath portion 120 which preferably longitudinally tightly engages both conductor means 12 and 14. Similarly, conductor means 16 and 14 are also contained as by a tubular sleeve or sheath portion 122 which also preferably longitudinally tightly engages both conductor means 14 and 16. In the preferred embodiment of this aspect of the invention the sheath portions 120 and 122 are flexible as not to interfere with the required bending of conductor means 12, 14 and 16. The flexibility and pliability of such sleeve portions 120 and 122 enhances the structural integrity of the assembly.

That is, the sleeves 120 and 122 effectively preclude someone from grasping only conductors 12 and 16 and exerting a pulling action thereon. Because of sleeves 120 and 122 when anyone grasps the conductor means extending from either side of connector 32, such are grasped as an assembly of conductor means 12 and 14 and an assembly of conductor means 16 and 14 thereby further assuring that tension forces applied thereto will be transmitted through not only connector 32 but the continuous conductor means 14, as well.

Although only one preferred embodiment and one modification of the invention have been disclosed and described, it is apparent that other embodiments and modifications of the invention are possible within the scope of the appended claims.

I claim:

1. Electrical circuit means, comprising first electrical conductor means, second electrical conductor means, third electrical conductor means, said first electrical conductor means comprising an inner disposed electrically conductive first core, outer disposed electrically insulating first cover means carried by said first core, said second electrical conductor means comprising an inner disposed electrically conductive second core, outer disposed electrically insulating second cover means carried by said second core, said third electrical conductor means comprising an inner disposed electrically conductive third core, outer disposed electrically insulating third cover means carried by said third core, said third electrical conductor means extending in a direction generally as that assumed by said first and second electrical conductor means and in at least relatively close proximity thereto, said first core having first and second ends effective for electrical connection, said second core having third and fourth ends effective for electrical connection, said third core having fifth and sixth ends effective for electrical connection, relatively low-tensile-strength electrical component means electrically situated generally between said second and third ends of said first and second cores respectively and electrically connected thereto, and connector means directly connected to said first second and third cover means and generally bridging said electrical component means, said connector means being effective to transmit at least a substantial portion of tensile forces applied from said first conductor means to said second conductor means and to that extent at least minimize the magnitude of such tensile forces experienced by said electrical component means, said connector means comprising a body of electrically insulating material, said body being molded as to envelop and directly contact said electrical component means and longitudinal portions of said first and second cover means as well as said second and third ends of said first and second cores, said body also enveloping a portion of said third electrical conductor means as to encompass and directly contact a longitudinal section of said third cover means and yet permit longitudinal portions of said third cover means and said fifth and sixth ends of said third core to extend beyond said body, said body thusly encompassing and directly contacting said longitudinal section of said third cover means being effective to transmit at least a portion of said tensile forces to said third conductor means.

2. Electrical circuit means according to claim 1 wherein said relatively low-tensile-strength electrical component means comprises electrical resistance means.

3. Electrical circuit means according to claim 1 wherein said relatively low-tensile-strength electrical component means comprises a plurality of electrical resistors.

4. Electrical circuit means according to claim 3 wherein said plurality of electrical resistors comprise at least two electrical resistors in electrically parallel relationship to each other.

5. Electrical circuit means according to claim 1 wherein said electrically insulating material of said body comprises polyvinyl chloride.

6. Electrical circuit means according to claim 1 wherein said sixth end of said third core is effective to be electrically connected to one electrical side of a source of electrical potential, wherein said fourth end of said second core is effective to be electrically connected to a second electrical side of said source of electrical potential, wherein said fifth end of said third core is electrically connected to one electrical side of electrically energizable bulb means, and wherein said first end of said first core is electrically connected to a second electrical side of said bulb means.

7. Electrical circuit means according to claim 6 wherein said bulb means comprises a light emitting diode.

8. Electrical circuit means according to claim 7 and further comprising zener diode means electrically in parallel with said light emitting diode.

9. Electrical circuit means according to claim 1 and further comprising flexible sheath means situated about and engaging said first and third conductor means, said sheath means extending along said first and third conductor means and terminating at one end at said body.

10. Electrical circuit means according to claim 9 and further comprising additional flexible sheath means situated about and engaging said second and third conductor means, said additional sheath means extending along said second and third conductor means and terminating at one end at said body.

11. Electrical circuit means according to claim 9 wherein said flexible sheath means comprises a tubular member internally engaging outer surface portions of said first and third conductor means.

12. Electrical circuit means according to claim 4 wherein said two resistors are also physically generally parallel to each other and arranged as to be in at least close proximity to each other.

13. Electrical circuit means according to claim 12 wherein said two resistors cooperate to define a trough-like recess extending generally longitudinally therealong, and wherein said third electrical conductor means is generally closely received by said trough-like recess.

14. Electrical circuit means according to claim 1 wherein said first cover means comprises means formed on the exterior thereof at least near said second end for affecting an operative interlock with said body, and wherein said second cover means comprises additional means formed on the exterior thereof at least near said third end for affecting an operative interlock with said body.

15. Electrical circuit means according to claim 1 wherein said first cover means comprises means formed on the exterior thereof at least near said second end for affecting an operative interlock with said body, wherein said second cover means comprises additional means formed on the exterior thereof at least near said third end for affecting a second operative interlock with said body, and wherein said third cover means comprises further means formed on the exterior thereof for affecting an operative interlock with said body.

16. Electrical circuit means according to claim 1 and further comprising flexible sheath means situated about and engaging said second and third conductor means, said sheath means extending along said second and third conductor means and terminating at one end of said body.

* * * * *